United States Patent
Ramaraju et al.

(10) Patent No.: US 8,710,916 B2
(45) Date of Patent: Apr. 29, 2014

(54) ELECTRONIC CIRCUIT HAVING SHARED LEAKAGE CURRENT REDUCTION CIRCUITS

(75) Inventors: Ravindraraj Ramaraju, Round Rock, TX (US); David R. Bearden, Austin, TX (US); Andrew C. Russell, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 146 days.

(21) Appl. No.: 13/020,565

(22) Filed: Feb. 3, 2011

(65) Prior Publication Data

US 2012/0200336 A1 Aug. 9, 2012

(51) Int. Cl.
*G05F 1/10* (2006.01)
*G05F 3/02* (2006.01)

(52) U.S. Cl.
USPC ............................ 327/544; 327/524; 327/530

(58) Field of Classification Search
USPC ........... 327/530, 538–544, 546; 323/312–317
See application file for complete search history.

(56) References Cited

U.S. PATENT DOCUMENTS

| | | | |
|---|---|---|---|
| 6,021,500 A | 2/2000 | Wang et al. | |
| 6,107,700 A * | 8/2000 | Ishikawa et al. | 307/116 |
| 6,292,015 B1 * | 9/2001 | Ooishi et al. | 326/33 |
| 6,794,904 B2 * | 9/2004 | Ooishi et al. | 326/103 |
| 7,042,274 B2 | 5/2006 | Hazucha et al. | |
| 7,080,269 B2 | 7/2006 | Baumgartner et al. | |
| 7,085,943 B2 | 8/2006 | Chun et al. | |
| 7,155,621 B2 | 12/2006 | Dai | |
| 7,248,510 B2 * | 7/2007 | Choi et al. | 365/189.09 |
| 7,262,631 B2 | 8/2007 | Chong | |
| 7,385,435 B2 | 6/2008 | Pham et al. | |
| 7,460,429 B2 | 12/2008 | Schoenfeld | |
| 7,463,013 B2 | 12/2008 | Plojhar | |
| 7,539,878 B2 | 5/2009 | Vaglica | |
| 7,609,047 B2 | 10/2009 | Ravichandran | |
| 7,638,903 B2 | 12/2009 | Pelley, III et al. | |
| 7,750,667 B2 * | 7/2010 | Jung | 326/31 |
| 7,825,720 B2 | 11/2010 | Ramaraju et al. | |
| 8,004,351 B2 * | 8/2011 | Ikenaga et al. | 327/544 |

(Continued)

OTHER PUBLICATIONS

Chang, J., et al., "The 65-nm 16-MB Shared on-Die L3 Cache for the Dual-Core Intel Xeon Processor 7100 Series", IEEE JSSC, vol. 45, No. 4, Apr. 2007, pp. 846-852.

(Continued)

*Primary Examiner* — Brandon S Cole
(74) *Attorney, Agent, or Firm* — Daniel D. Hill; David G. Dolezal (57) ABSTRACT

An electronic circuit includes a plurality of circuit blocks, a plurality of bias circuits, a switching circuit, and plurality of transistors. The plurality of circuit blocks each includes a high power terminal and a low power terminal. The switching circuit includes a plurality of switches for selectively coupling a bias circuit of the plurality of bias circuits to the low power terminal of a circuit block of the plurality of circuit blocks. Each bias circuit of the plurality of bias circuits is selectively couplable to the low power terminal of each of the plurality of circuit blocks. Each transistor of the plurality of transistors has a first current terminal coupled to a circuit ground terminal, and each transistor of the plurality of transistors has a control terminal for controlling the conductivity of the plurality of the transistors by a bias circuit of the plurality of bias circuits.

23 Claims, 5 Drawing Sheets

(56) References Cited

U.S. PATENT DOCUMENTS

| | | |
|---|---|---|
| 8,319,548 B2 | 11/2012 | Ramaraju et al. |
| 2002/0017947 A1* | 2/2002 | Ooishi et al. ................ 327/544 |
| 2003/0102903 A1* | 6/2003 | Cho ............................. 327/544 |
| 2007/0159239 A1* | 7/2007 | Rhee ............................ 327/544 |
| 2009/0189636 A1 | 7/2009 | Amedeo et al. |
| 2009/0203410 A1 | 8/2009 | Lu |
| 2010/0207687 A1 | 8/2010 | Ramaraju et al. |
| 2010/0207688 A1 | 8/2010 | Ramaraju et al. |
| 2010/0283445 A1 | 11/2010 | Ramaraju et al. |

OTHER PUBLICATIONS

Tschanz, J.W., et al., "Dynamic Sleep Transistor and Body Bias for Active Leakage Power Control of Microprocessors", IEEE, JSSC, vol. 38, No. 11, Nov. 2003, pp. 1838-1845.

Vangal, S.R., et al., "An 80-Tile Sub-100-W TeraFLOPS Processor in 65-nm CMOS", IEEE, JSSC, vol. 43, No. 1, Jan. 2008, pp. 29-41.

Sackinger, E., et al., "A High-Swing, High-Impedance MOS Cascode Circuit", IEEE, JSSC, vol. 25, No. 1, Feb. 1990, pp. 289-298.

Chen, Y.H., et al., "A 0.6 V Dual-Rail Compiler SRAM Design on 45 nm CMOS Technology With Adaptive SRAM Power for Lower $VDD\_min$ VLSIs", IEEE, JSSC, vol. 44, No. 4, Apr. 2009, pp. 1209-1215.

Khellah, M., et al., "A 256-Kb Dual-Vcc SRAM Building Block in 65-nm CMOS Process With Actively Clamped Sleep Transistor", IEEE, JSSC, vol. 42, No. 1, Jan. 2007, pp. 233-242.

Wang, Y., et al., "A 4.0 GHz 291 Mb Voltage-Scalable SRAM Design in 32 nm High-K Metal-Gate CMOS with Integrated Power Management", IEEE, ISSCC 2009, Session 27, SRAM and Emerging Memory, 27.1; pp. 456-458.

Wang, Y., et al., "A 4.0 GHz 291 Mb Voltage-Scalable SRAM Design in 32nm High-k = Metal-Gate CMOS Technology with Integrated Power Management", Logic Technology Development, Hillsboro, or, Intel Corporation, Sep. 27, 2001, pp. 1-28.

Seno, K., et al., "A 9-ns 16-Mb CMOS SRAM with Offset-Compensated Current Sense Amplifier", IEEE, JSSC, vol. 28, No. 11, Nov. 1993, pp. 1119-1124.

\* cited by examiner

ELECTRONIC CIRCUIT HAVING SHARED LEAKAGE CURRENT REDUCTION CIRCUITS

BACKGROUND

1. Field

This disclosure relates generally to electronic circuits, and more specifically, to an electronic circuit having a plurality of shared leakage current reduction circuits.

2. Related Art

Lower power consumption has been gaining importance in integrated circuits due to, for example, wide spread use of portable and handheld applications. Most circuits in handheld devices are typically off, for example, in an idle or deep sleep mode, for a significant portion of time, consuming only leakage power. As transistor leakage currents increase with finer geometry manufacturing processes, it becomes more difficult to meet chip leakage targets using traditional power reduction techniques. Therefore, reducing leakage current is becoming an increasingly important factor in extending battery life.

There are several methods for reducing the leakage current of an integrated circuit during a low power mode. One method involves providing a "virtual" ground terminal that can be at ground potential during a normal operating mode and then increased above ground during a low power operating mode to reduce the leakage current. However, in some integrated circuits, leakage current can vary depending on a number of factors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an electronic circuit having a plurality of circuit blocks, or modules, and a plurality of leakage current reduction circuits. Each of the leakage current reduction circuits includes a leakage reduction transistor coupled between the circuit block and ground. A bias circuit utilizes feedback to provide a regulated bias voltage to the leakage reduction transistor. A switching circuit is coupled between the circuit blocks and the leakage current reduction circuits. The switching circuit is for connecting a leakage current reduction circuit to a circuit block during a low power mode. In one embodiment, more than one leakage reduction circuit can be connected to a circuit block.

In one aspect, there is provided, an electronic circuit comprising: a plurality of circuit blocks, each circuit block of the plurality of circuit blocks including a first power terminal and a second power terminal; a plurality of bias circuits for controlling current leakage reduction of the plurality of circuit blocks; a switching circuit including a plurality of switches for selectively coupling a bias circuit of the plurality of bias circuits to the first power terminal of a circuit block of the plurality of circuit blocks, where each bias circuit is selectively couplable to each of the plurality of circuit blocks and is concurrently couplable to more than one circuit block of the plurality of circuit blocks via the switching circuit; and a plurality of leakage reduction transistors, each leakage reduction transistor of the plurality of leakage reduction transistors including a first current terminal coupled to a power supply voltage terminal, the plurality of bias circuits controlling the conductivity of the plurality of leakage reduction transistors to reduce leakage current of the plurality of circuit blocks, wherein each transistor of the plurality of transistor includes a control terminal for controlling the conductivity of the leakage reduction transistor. The electronic circuit may further comprise a controller, the controller controlling the switching circuit for selectively coupling a bias circuit of the plurality of bias circuits to the first power terminal of a circuit module of the plurality of circuit modules for reducing the leakage current of the circuit module, wherein the controller selects which bias circuit of the plurality of bias circuits to selectively couple to the first power terminal of a circuit module based on a measured leakage current value for the circuit module. The electronic circuit may further comprise at least one temperature sensor, the controller selects which bias circuit of the plurality of bias circuits to selectively couple to the first power terminal of a circuit module further based on temperature information from the at least one temperature sensor. Each leakage reduction transistor of the plurality of leakage reduction transistors may be associated with a circuit module of the plurality of circuit modules, wherein each leakage reduction transistor of the plurality of leakage reduction transistors may include a second current terminal coupled to the first power terminal of its associated circuit module; and wherein the switching circuitry may selectively couple a bias circuit of the plurality of bias circuits to the control terminal of the leakage reduction transistor of the plurality of leakage reduction transistors, where each bias circuit is selectively couplable to the control terminal of each leakage reduction transistor via the switching circuitry. Each bias circuit of the plurality of bias circuits may include a sense line, wherein the sense line of each bias circuit of the plurality of bias circuits may be selectively couplable to the first power terminal of each circuit module of the plurality of circuit modules via the switching circuit. Each leakage reduction transistor of the plurality of leakage reduction transistors may be associated with a bias circuit of the plurality of bias circuits, wherein each leakage reduction transistor of the plurality of leakage reduction transistors may include a second current terminal; and the second current terminal of each leakage reduction transistor of the plurality of leakage reduction transistors may be selectively couplable to the first power terminal of each circuit module of the plurality of circuit modules via the switching circuit. The power supply terminal may be a ground terminal and the first power terminal of a circuit module may be a low voltage power terminal of the circuit module. Each bias circuit of the plurality of bias circuits may be characterized as being a self biasing circuit.

In another aspect, there is provided, an electronic circuit comprising: a plurality of circuit blocks, each circuit block of the plurality of circuit blocks including a high power terminal and a low power terminal; a plurality of bias circuits; a switching circuit including a plurality of switches for selectively coupling a bias circuit of the plurality of bias circuits to the low power terminal of a circuit block of the plurality of circuit blocks, where each bias circuit of the plurality of bias circuits is selectively couplable to the low power terminal of each of the plurality of circuit blocks; and a plurality of transistors, each transistor of the plurality of transistors including a first current terminal coupled to a circuit ground terminal, wherein each transistor of the plurality of transistors includes a control terminal for controlling the conductivity of the plurality of the transistors by a bias circuit of the plurality of bias circuits. Each bias circuit may be concurrently couplable to the low power terminal of more than one circuit block of the plurality of circuit blocks via the switching circuit. Each transistor of the plurality of transistors may be associated with a circuit module of the plurality of circuit modules, wherein each transistor of the plurality of transistors may include a second current terminal coupled to the low power terminal of its associated circuit module; and wherein the switching circuitry may selectively couple a bias circuit of the plurality of bias circuits to the control terminal of a transistor of the plurality of transistors, where each bias circuit may be selectively couplable to the control terminal of each transistor of the plurality of transistors via the switching circuitry for controlling the conductivity of the each transistor. Each bias circuit of the plurality of bias circuits may include a sense line, wherein the sense line of each bias circuit of the plurality of bias circuits is selectively couplable to the low power terminal of each circuit module of the plurality of circuit modules via the switching circuit. Each bias circuit of the plurality of bias circuits may be characterized as being a self biasing circuit. The electronic circuit may further include a controller, the controller may control the switching circuit for selectively coupling a bias circuit of the plurality of bias circuits to the low power terminal of a circuit module of the plurality of circuit modules for reducing the leakage current of the circuit module, wherein the controller may select which bias circuit of the plurality of bias circuits to selectively couple to the low power terminal of the circuit module based on a measured leakage current value for the circuit module.

In yet another aspect, there is provided, an electronic circuit comprising: a plurality of circuit blocks, each circuit block of the plurality of circuit blocks includes a power terminal; a plurality of transistors, each transistor of the plurality of transistors is associated with a circuit module of the plurality of circuit modules, wherein each transistor of the plurality of transistors includes a first current terminal coupled to a power supply terminal and a second current terminal coupled to the power terminal of its associated circuit module, each transistor of the plurality of transistors includes a control terminal for controlling the conductivity of the transistor; a plurality of bias circuits; and a switching circuit including a plurality of switches for selectively coupling a bias circuit of the plurality of bias circuits to the first power supply terminal of a circuit block of the plurality of circuit blocks and a control terminal of a transistor of the plurality of transistors associated with the circuit block, where each bias circuit is selectively couplable to the first power terminal of each of the plurality of circuit blocks via the switching circuit and selectively couplable to the control terminal of each transistor of the plurality of transistors via the switching circuit. Each bias circuit of the plurality of bias circuits may include a sense line and a control line. The switching circuit may selectively couple the sense line of the each bias circuit of the plurality of bias circuits to the first power terminal of a circuit block of the plurality of circuit blocks and the control line of the each bias circuit to the control terminal of the transistor associated with the circuit block. The first power terminal of each circuit module of the plurality of circuit modules may be selectively couplable to each bias circuit of the plurality of circuit modules. Each bias circuit may be concurrently culpable to the first power terminal of more than one circuit block of the plurality of circuit blocks via the switching circuit. The electronic circuit may further comprise a controller. The controller may be for controlling the switching circuit for selectively coupling a bias circuit of the plurality of bias circuits to the first power terminal of a circuit module of the plurality of circuit modules for reducing the leakage current of the circuit module, wherein the controller may select which bias circuit of the plurality of bias circuits to selectively couple to the first power terminal of the circuit module based on a measured leakage current value for the circuit module.

In yet another aspect, there is provided, a method for controlling leakage current in a circuit module, the method comprising: measuring leakage current in a circuit module; and selecting a bias circuit of a plurality of bias circuits and coupling the selected bias circuit to the circuit module and controlling the conductivity of a transistor coupled to the circuit module with the bias circuit to control the leakage current of the circuit module, wherein the selected bias circuit is selected from the plurality of bias circuits based upon the measured leakage current. The selected bias circuit may be further selected based on a measured data retention voltage value of the circuit module. Each bias circuit may include a transistor associated with the bias circuit from a plurality of transistors, wherein the coupling the selected bias circuit to the control module may include coupling the associated transistor to the circuit module, wherein the controlling the conductivity of a transistor coupled to the circuit module with the bias circuit to control the leakage current of the circuit module may include controlling the conductivity of the associated transistor coupled to the circuit module with the selected bias circuit to control the leakage current of the circuit module. The method may further comprise detecting a change in temperature; and in response to the detected change in temperature, selecting a second bias circuit of the plurality of bias circuits, decoupling the selected bias circuit from the circuit module, coupling the second selected bias circuit to the circuit module, and controlling the conductivity of a transistor coupled to the circuit module with the second selected bias circuit to control the leakage current of the circuit module, wherein the second selected bias circuit provides for a different data retention margin than the selected bias circuit.

A semiconductor substrate of the integrated circuit described herein can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
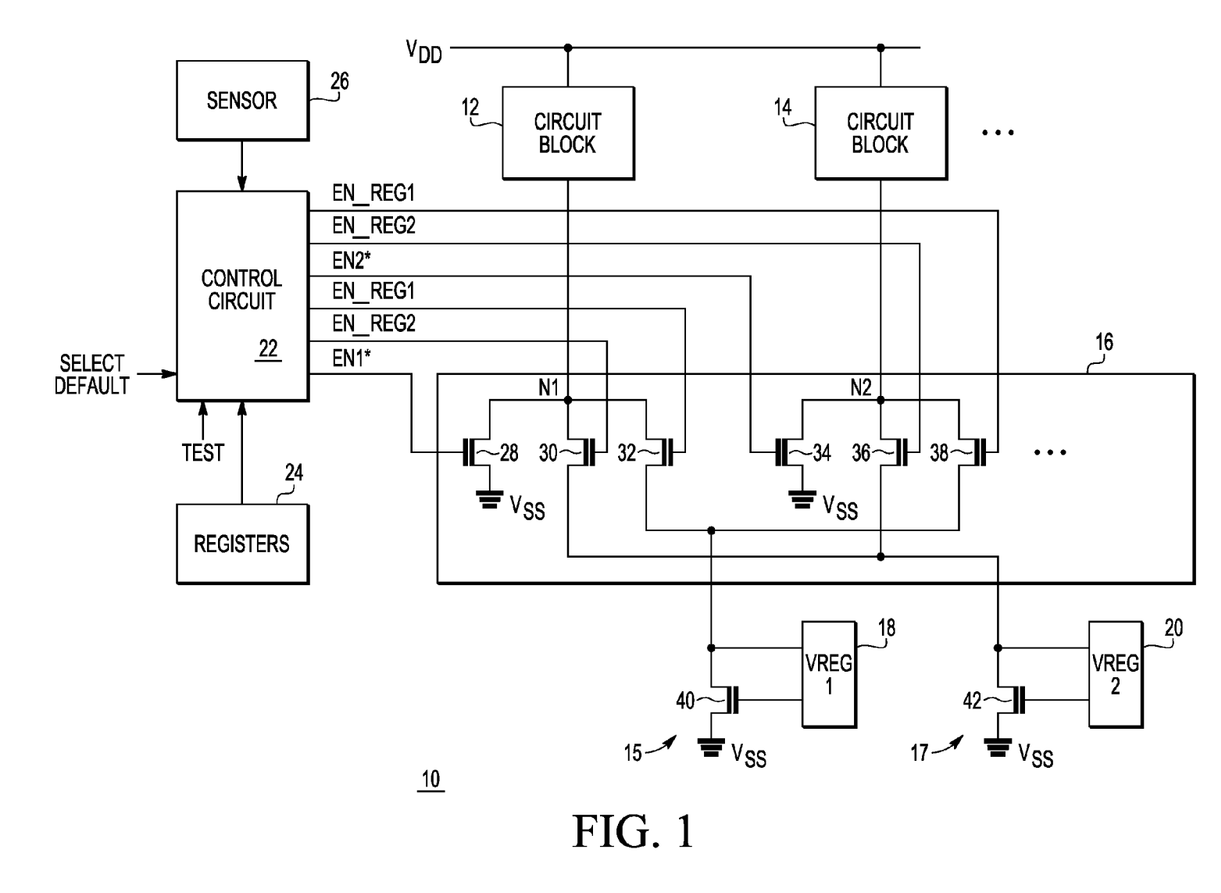
FIG. 1 illustrates, in partial block diagram form and partial schematic diagram form, an electronic circuit in accordance with an embodiment.

FIG. 1 illustrates, in partial block diagram form and partial schematic diagram form, an electronic circuit 10 in accordance with an embodiment. Electronic circuit 10 includes a plurality of circuit blocks represented by circuit blocks 12 and 14, and a plurality of leakage reduction circuit represented by leakage reduction circuits 15 and 17. Circuit blocks 12 and 14 are coupled between a power supply voltage terminal labeled "VDD" and a node labeled N1 and N2, respectively. A switching circuit 16 is coupled between circuit blocks 12 and 14 and leakage reduction circuits 15 and 17. Switching circuit 16 functions to connect nodes N1 and N2 to power supply voltage terminal VSS or to leakage reduction circuits 15 and/or 17. Control circuit 22, registers 24, and sensor 26 are coupled to control the operation of switching circuit 16. In one embodiment, electronic circuit 10 is an integrated circuit. Circuit blocks 12 and 14 can be any type of circuits such as for example analog, digital, or a combination of analog and digital circuits. By way of example, electronic circuit 10 may be characterized as a system-on-a-chip (SoC) integrated circuit having one or more processors, memory, logic, and analog circuits. In another embodiment, electronic circuit 10 may include more than one integrated circuit and discrete circuit components.

Control circuit 22 has an input for receiving a test signal labeled "TEST", an input for receiving a signal labeled "SELECT DEFAULT", and a plurality of outputs for providing enable signal EN_REG1, EN_REG2, EN2*, and EN1*. Control circuit 22 also has an input connected to an output of sensor 26, and an input connected to registers 24.

Figure 3:
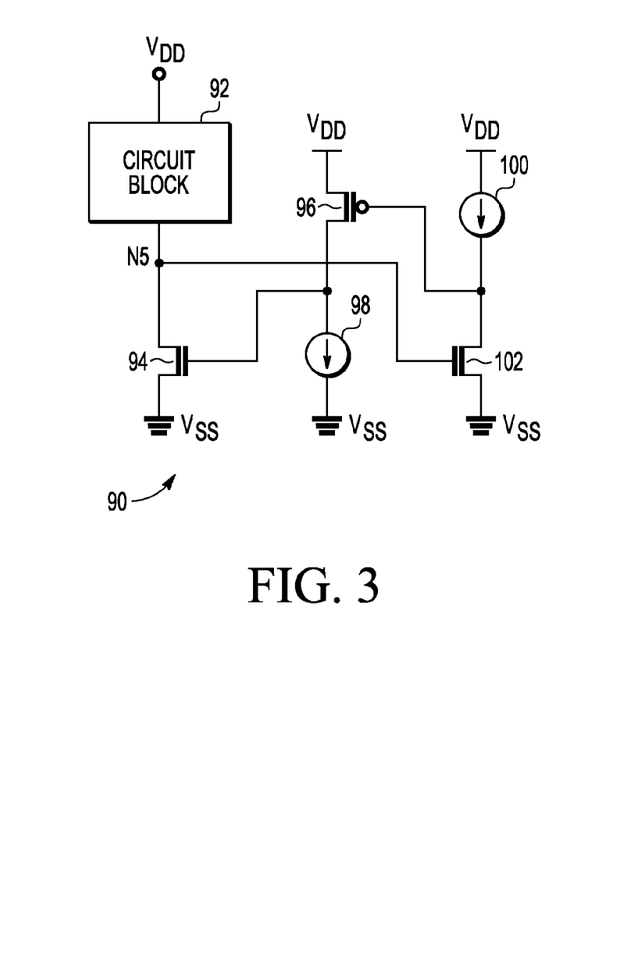
FIG. 3 illustrates, in partial block diagram form and partial schematic diagram form, an embodiment of a leakage reduction circuit for use in the electronic circuits of FIG. 1 and FIG. 2.
Figure 4:
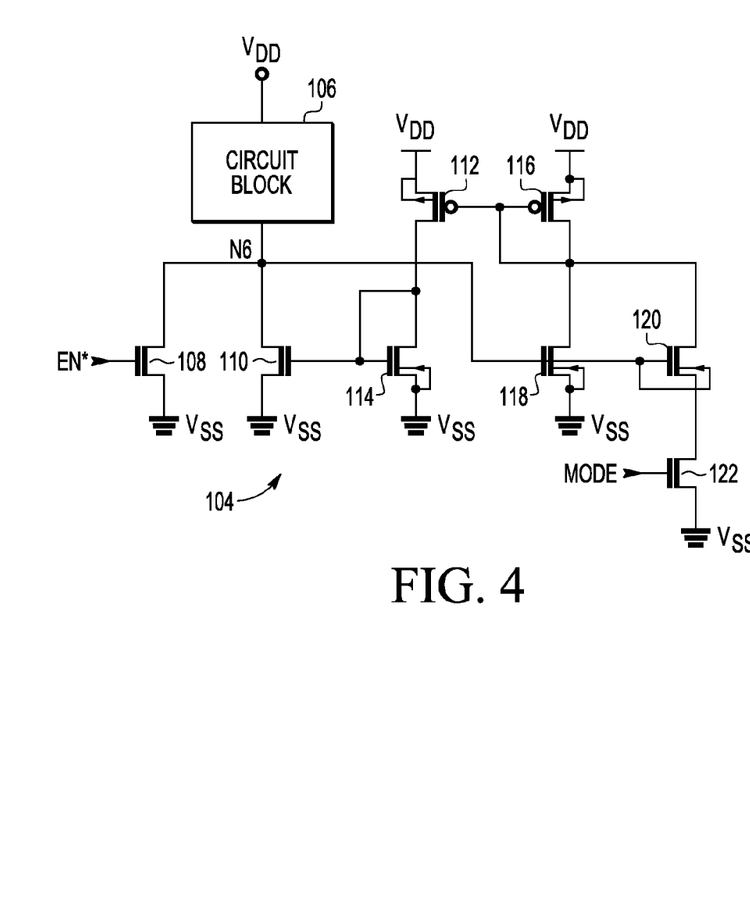
FIG. 4 illustrates, in partial block diagram form and partial schematic diagram form, an embodiment of a leakage reduction circuit for use in the electronic circuits of FIG. 1 and FIG. 2.

Leakage current reduction circuit 15 includes leakage reduction transistor 40 and bias circuit 18. Leakage current reduction circuit 17 includes leakage reduction transistor 42 and bias circuit 20. Bias circuit 18 has an input sense line connected to transistors 32 and 38, and an output connected to the gate of transistor 40. Bias circuit 20 has an input sense line connected to transistors 30 and 36, and an output connected to the gate of transistor 42. Example embodiments of leakage current reduction circuits are illustrated in FIGS. 3 and 4.

Switching circuit 16 includes a plurality of transistors, such as transistors 28, 30, 32, 34, 36, and 38, for selectively connecting leakage current reduction circuits 15 and 17 to circuit blocks 12 and 14 under the control of control circuit 22 during a low power mode. Each of transistors 28, 30, 32, 34, 36, and 38 are N-channel metal oxide semiconductor (MOS) transistors. In another embodiment, a different transistor type may be used. Also, in another embodiment, the transistors may include transmission gates comprising parallel-connected N-channel and P-channel transistors. Transistor 28 has a first current electrode connected to a node labeled "N1", a second current electrode connected to a power supply voltage terminal labeled "VSS", and a control electrode connected to an input of control circuit 22 for receiving an enable signal labeled "EN1*". Leakage reduction transistor 30 has a first current electrode connected to node N1, a second current electrode, and a control electrode for receiving a bias circuit enable signal labeled "EN_REG2". Leakage reduction transistor 32 has a first current electrode connected to node N1, a second current electrode, and a control electrode for receiving a bias circuit enable signal labeled "EN_REG1". Transistor 34 has a first current electrode connected to a node labeled "N2", a second current electrode connected to VSS, and a control electrode for receiving an enable signal from control circuit 22 labeled "EN2*". Leakage reduction transistor 36 has a first current electrode connected to node N2, a second current electrode, and a control electrode for receiving bias circuit enable signal EN_REG2. Leakage reduction transistor 38 has a first current electrode connected to node N2, a second current electrode, and a control electrode for receiving bias circuit enable signal EN_REG1. In another embodiment, switching circuit 16 may be implemented in other ways, for example, switching circuit 16 may be implemented as a crossbar switch, a multiplexer, or an arbitration circuit.

In leakage current reduction circuit 15, transistor 40 has a first current electrode connected to the second current electrodes of transistors 32 and 38, a second current electrode connected to VSS, and a control electrode connected to an output of bias circuit 18. Bias circuit 18 has an input connected to the first current electrode of transistor 40. Transistor 42 has a first current electrode connected to the second current electrodes of transistors 30 and 36, a second current electrode connected to VSS, and a control electrode connected to an output of bias circuit 20. Bias circuit 20 has an input connected to the first current electrode of transistor 42.

During a normal operating mode, enable signals EN1* and EN2* are asserted as logic high signals. Transistors 28 and 34 are both on, or conductive, and circuits 12 and 14 are coupled to receive a full rail power supply voltage between power supply voltage terminal VDD and a power supply voltage terminal VSS. In one embodiment, VDD is a positive power supply voltage and VSS is ground. In another embodiment, the voltages may be different.

During a low power mode operating mode, leakage current reduction circuit 15 can be connected to either one or both of circuit blocks 12 and 14 via switching circuit 16. Likewise, leakage current reduction circuit 17 can be connected to either one or both of circuit blocks 12 and 14. Circuit block 12 or 14 can be connected to leakage reduction circuit 15 or 17 or both as determined by the control signals from control circuit 22. To enable the leakage current reduction circuits, transistors 28 and 34 are turned off, or made non-conductive by negating enable signals EN1* and EN2* as logic low signals. Leakage current reduction circuit 15 can then be connected to, for example, node N1 in response to transistor 32 receiving a logic high enable signal EN_REG1. Leakage current reduction circuit 17 can be connected to, for example, node N1, in response to transistor 30 receiving a logic high enable signal EN_REG2. Leakage current reduction circuits 15 and 17 function to reduce leakage current in circuits 12 and 14 by elevating, or raising, the voltage at nodes N1 and N2, respectively, above voltage VSS. Bias circuit 18 controls the bias voltage of transistor 40 in response to monitoring the voltage at the first current electrode of transistor 40. The amount of leakage current passed by transistors 40 and 42 is determined by the size of transistors 40 and 42 and by the bias voltage provided by bias circuits 18 and 20. Control circuit 22 has an input connected to registers to for receiving control information for controlling the operation of leakage reduction circuits 15 and 17. For example, depending on the amount of leakage current a circuit provides during a low power mode, one or more leakage current reduction circuits may be needed to raise the lower power supply voltage by a predetermined amount. The predetermined amount may be based on, for example, a measured data retention voltage of a circuit block having a data storage element. The number of leakage reduction circuits and other information may be programmed into registers 24. Also, a sensor, such as a temperature sensor, may be connected to control circuit 22. Generally, a higher voltage is required to maintain a certain stability margin in a circuit as the temperature of the circuit components decreases. In one embodiment, a temperature sensor is used to turn off the leakage reduction circuits when a predetermined low temperature is reached. In another embodiment, a bias circuit is selected to provide leakage reduction based on temperature sensor 26 detecting a change in temperature. Also, a second biasing circuit may be added to supplement a first biasing circuit based on detecting a change in temperature. The change in temperature may be detected by comparing a sensed temperature with a temperature threshold (not shown) stored in registers 24.

Figure 2:
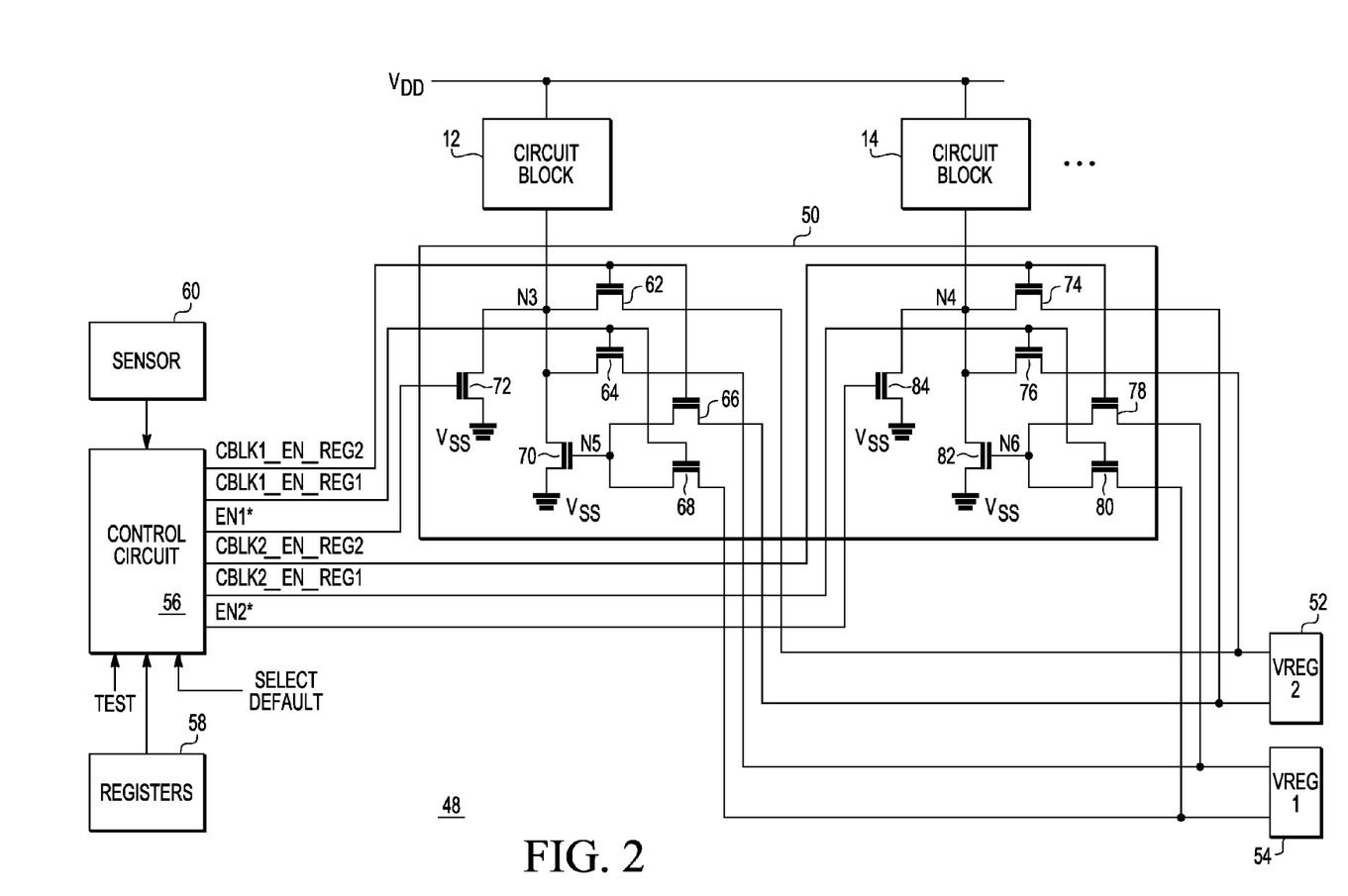
FIG. 2 illustrates, in partial block diagram form and partial schematic diagram form, an electronic circuit in accordance with another embodiment.

FIG. 2 illustrates, in partial block diagram form and partial schematic diagram form, an electronic circuit 48 in accordance with another embodiment. Generally, electronic circuit 48 includes circuit blocks 12 and 14, switching circuit 50, bias circuits 52 and 54, control circuit 56, registers 58, and sensor 60. Switching circuit 50 includes N-channel transistors 62, 64, 66, 68, 70, 72, 74, 76, 78, 80, 82, and 84.

Electronic circuit 48 differs from electronic circuit 10 in that each circuit block 12 and 14 has a single dedicated leakage reduction transistor, where the single leakage reduction transistor is biased by one or both of bias circuits 52 and 54 during a low power operating mode. For example, circuit block 12 is connected to leakage reduction transistor 70 at node N3, and circuit block 14 is connected to leakage reduction transistor 82 at node N4. Leakage reduction transistor 70 is biased by bias circuit 52 at nodes N3 and N5 in response to transistors 62 and 66 being conductive. Also, leakage reduction transistor 70 is biased by bias circuit 54 at nodes N3 and N5 in response to transistors 64 and 68 being conductive. Likewise, leakage reduction transistor 82 is biased by bias circuit 52 at nodes N4 and N6 when transistors 74 and 78 are conductive and biased by bias circuit 54 when transistors 76 and 80 are conductive. During a normal operating mode, transistors 72 and 84 are conductive so that circuit blocks 12 and 14 are supplied with a full rail power supply voltage between VDD and VSS.

Control circuit 56 (FIG. 2) differs from control circuit 22 (FIG. 1) in that control circuit 56 has VREG bias circuit enable signals dedicated to each of circuit blocks 12 and 14. For example, either bias circuit 52 or bias circuit 54 can be coupled to node N3 and node N5 of leakage reduction transistor 70 in circuit block 12 in response to transistors 64 and 68 receiving a logic enable signal CBLK EN REG1 or transistors 62 and 66 receiving a logic high enable signal CBLK1 EN REG2. Likewise, either bias circuit 52 or bias circuit 54 can be coupled to node N4 and node N6 of leakage reduction transistor 82 in circuit block 14 in response to transistors 76 and 80 receiving a logic high enable signal CBLK2 EN REG1 or transistors 74 and 78 receiving a logic high enable signal CBLK2 EN REG2.

By asserting and deasserting bias circuit enable signals CBLK1 EN REG1, CBLK1 EN REG2, CBLK2 EN REG1, and CBLK2 EN REG2, four connection configurations of bias circuits 52 and 54 to circuit blocks 12 and 14 can be made. For example, circuit blocks 12 and 14 can both be connected to bias circuit 52; circuit blocks 12 and 14 can both be connected to bias circuit 54; circuit block 12 can be biased by bias circuit 52 while circuit block 14 is biased by bias circuit 54; and circuit block 12 can be biased by bias circuit 54 while circuit block 14 is biased by bias circuit 52.

Although the embodiment of FIG. 2 includes two circuit blocks, two bias circuits, and a control circuit for providing 6 control signals, one of ordinary skill in the art will know that N number of circuit blocks can be biased by M number of bias circuits a total of $M^N$ number of ways, where N and M are integers and M may or may not be equal to N.

FIG. 3 and FIG. 4 illustrate exemplary embodiments of leakage current reduction circuits for use in the electronic circuits of FIG. 1 and FIG. 2. Other circuit configurations are also possible. FIG. 3 illustrates, in partial block diagram form and partial schematic diagram form, leakage current reduction circuit 90 for use in the electronic circuits of FIG. 1 and FIG. 2. Leakage current reduction circuit 90 includes transistors 94, 96, and 102, and current sources 98 and 100, and functions to regulate a voltage at a node labeled "N5". Transistors 96 and 102 and current sources 98 and 100 together function to provide a bias voltage to control the gate of transistor 94. Transistor 94 is connected between node N5 and VSS and provides a current sink for leakage current in circuit block 92 when circuit block 92 is in a low power mode. Circuit block 92 may be one of circuit blocks 12 and 14 in FIGS. 1 and 2. Transistors 96 and 102 and current sources 98 and 100 form a bias circuit that may be used in any one of bias circuits 18, 20, 52, and 54 of FIGS. 1 and 2. In operation, transistor 102 receives a feedback voltage from node N5. Current source 100 provides a current to establish a voltage at the gate of P-channel transistor 96. When the voltage at node N5 increases above a predetermined voltage, transistor 102 becomes more conductive, thus lowering the voltage at the gate of transistor 96. Transistor 96 becomes more conductive, thus increasing the voltage at the gate of transistor 94 to cause transistor 94 to be more conductive and sink more current to lower the voltage at node N5. Conversely, when the voltage at node N5 decreases below a predetermined voltage, transistor 102 becomes less conductive, thus increasing the voltage at the gate of transistor 96. Transistor 96 becomes less conductive, thus decreasing the voltage at the gate of transistor 94 to cause transistor 94 to be less conductive and thus sink less current to increase the voltage at node N5. Note that in other embodiments, an enable transistor (not shown), connected in parallel with transistor 94, may be used to enable or disable leakage reduction circuit 90.

FIG. 4 illustrates, in partial block diagram form and partial schematic diagram form, leakage reduction circuit 104 for use in the electronic circuits of FIG. 1 and FIG. 2. Leakage current reduction circuit 104 includes transistors 110, 112, 114, 116, 118, 120, and 122, and functions to regulate a voltage at a node labeled "N6". Transistors 112, 114, 116, 118, 120, and 122 function to provide a bias voltage to control the gate of transistor 110. Transistor 110 is connected between node N6 and VSS and provides a current sink for leakage current in circuit block 106 when circuit block 106 is in a low power mode. Circuit block 106 may be one of circuit blocks 12 and 14 in FIGS. 1 and 2. Transistor 108 is coupled between node N6 and Vss. During a normal operating mode, transistor 108 couples node N6 to VSS in response to an enable signal labeled "EN*" being a logic high voltage. When signal EN* is a logic high, transistor 108 is conductive, and sinks substantially all of the operating current of circuit block 106 to VSS. During a low power operating mode, signal EN* is a logic low voltage, causing transistor 108 to be substantially non-conductive. Any leakage current from circuit block 106 is sunk by transistor 110.

In operation, leakage reduction circuit 104 functions to maintain the voltage at node N6 at one of two different predetermined voltage levels. During a normal operating mode, enable signal EN* is negated as a logic high voltage causing transistor 108 to be conductive, thus coupling VSS to node N6. During a low power mode, enable signal EN* is asserted as a logic low voltage causing transistor 108 to be substantially non-conductive. Leakage current from circuit block 106 will cause the voltage at node N6 to increase. Transistors 118, 116, 112, and 114 provide a feedback path from the gates of transistors 112 and 118 to node N6. Generally, the gates of transistors 118 and/or 120 are coupled to sense the voltage at node N6 depending on the logic state of mode signal MODE. When transistor 118 responds to the increasing voltage, the feedback path controls the voltage at the control electrode of transistor 110 to maintain the voltage at node N6 at a predetermined voltage level. The body terminal of transistor 120 is connected to node N6 so that an increasing voltage at node N6 lowers the threshold voltage (VT) of transistor 120. Lowering the VT in this manner improves the conductivity of the transistor 120 without increasing the size of transistor 120. In one embodiment with a power supply voltage of 0.9 volts, the predetermined voltage level is about 300 millivolts (mV) above $V_{SS}$, where $V_{SS}$ is at ground potential in the illustrated embodiment. In another embodiment, the predetermined voltage level is different. More specifically, during low power mode, the increasing voltage at node N6 will cause transistor 120 to start to become conductive, decreasing the voltage at the gates of transistors 112 and 116. The decreasing voltage will bias transistors 112 and 116 to start to become conductive. When transistor 112 becomes conductive, the voltage at the gate of transistor 110 will increase. The increasing voltage will cause transistor 110 to be more conductive and reduce the voltage at node N6. Thus, transistor 110 will maintain the voltage at node N6 the predetermined voltage level above VSS.

Because the power supply voltage is already very low (e.g. 0.9 volts), and due to process variations and electrical characteristics of the transistors and the power supply voltage, the data state of circuit block 106 may become easily corruptible, or unstable, when transitioning from a normal mode to a low power mode. In the case where circuit block 106 is an SRAM array, increasing the voltage at node N6 too much can reduce margins to the point where memory cells inadvertently change logic states. Therefore, it is important that the voltage at node N6 transition smoothly and without any overshoot of the predetermined voltage above ground. In leakage reduction circuit 104, transistors 112 and 114 form a very low gain inverting stage so that the voltage transitions at node N6 are over-dampened. This functions to maintain adequate margins in the memory cells that would otherwise be compromised if the voltage at node N6 had any overshoot. Adding margin to accommodate any overshoot at node N6 would reduce the predetermined voltage above ground that the voltage at node N6 could increase. This would increase the amount of leakage current. Therefore, it is desirable to have a circuit that consumes a small current to regulate the voltage at N6 while having an over-dampened response (no overshoot), while also having adequate gain to maintain the voltage at node N6 at the predetermined voltage level above VSS.

When operating in a low power mode and mode signal MODE is not asserted as a logic high, transistor 122 is substantially non-conductive and only transistor 118 controls the voltage at the gates of transistors 112 and 116. Transistors 112 and 116 are connected together as a current mirror and control the gate voltage transistor 110 in response to the voltage at node N6. However, when operating in low power mode and mode signal MODE is asserted, transistor 122 is conductive and both transistors 118 and 120 work together to lower the voltage at the gates of transistors 112 and 116. This causes transistor 110 to become more conductive so that the voltage at node N6 is pulled lower than if transistor 118 was working alone. In one embodiment, the voltage at node N6 is maintained at about 200 mV when mode signal MODE is asserted, and the voltage at node N6 is maintained at about 300 mV when mode signal MODE is negated.

In another embodiment, each bias circuit may be characterized as being a self biasing circuit instead of being feedback controlled as illustrated in FIG. 3 and FIG. 4.

Figure 5:
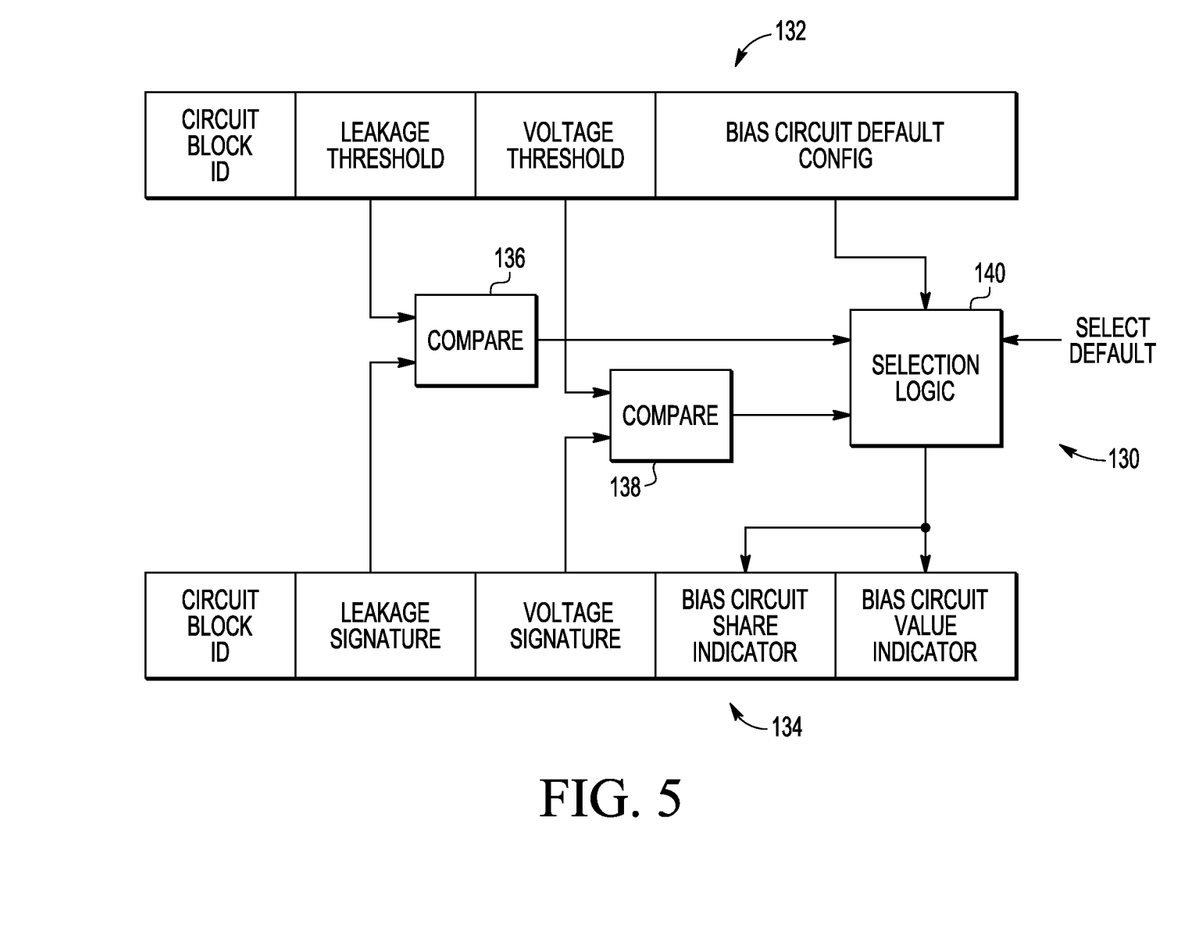
FIG. 5 illustrates, in block diagram form, a portion of the control circuit and the registers of the embodiments of FIGS. 1 and 2.

FIG. 5 illustrates, in block diagram form, registers 132 and 134 and a control circuit 130 for use with the embodiments of FIGS. 1 and 2. Registers 132 and 134 may be a portion of registers 24 and control circuit 130 may be a portion of control circuit 22 of FIG. 1. Likewise, registers 132 and 134 may be a portion of registers 58 and control circuit 130 may be a portion of control circuit 56 of FIG. 2. Registers 132 and 134 and control circuit 130 are used to determine a configuration policy for determining when and how the leakage reduction circuits are used when operating in a low power mode. Register 132 includes a plurality of bits that are subdivided into multiple bit fields labeled "CIRCUIT BLOCK ID", "LEAKAGE THRESHOLD", "VOLTAGE THRESHOLD", AND "BIAS CIRCUIT DEFAULT CONFIG". Register 134 includes a plurality of bits that are sub-divided into multiple bit fields labeled "CIRCUIT BLOCK ID", "LEAKAGE SIGNATURE", "VOLTAGE SIGNATURE", "BIAS CIRCUIT SHARE INDICATOR", AND "BIAS CIRCUIT VALUE INDICATOR". Registers 132 and 134 may also include a bit field for storing a temperature threshold (not shown). Each bit field may include one or more bits. Control circuit 130 includes comparators 136 and 138 and selection logic 140. Values to be stored in registers 132 and 134 are determined during a test mode. Test mode is entered by asserting test signal TEST to control circuit 22 in the embodiment of FIG. 1, or to control circuit 56 in the embodiment of FIG. 2.

In one embodiment, a leakage threshold voltage stored in the LEAKAGE THRESHOLD bit field of register 132 for a particular circuit block is set to a base value. The base value may be determined, for example, during a design phase for the integrated circuit by modeling, simulation, or by using a leakage estimation utility. A measured leakage current for the circuit block is stored in the LEAKAGE SIGNATURE bit field of register 134. The measured leakage current may be determined after manufacturing the integrated circuit during a wafer-level or package-level test under control of the test signal TEST illustrated in FIG. 1 and FIG. 2 as an input to control circuits 22 and 56, respectively. A circuit block ID identifying the particular circuit block is set in registers 132 and 134 corresponding to the bit fields LEAKAGE THRESHOLD and LEAKAGE SIGNATURE. The other bit fields of registers 132 and 134 can be determined similarly. As illustrated in FIG. 5, the LEAKAGE THRESHOLD value and the LEAKAGE SIGNATURE value are compared by comparator 136 and the VOLTAGE THRESHOLD value is compared with the VOLTAGE SIGNATURE value by comparator 138. The results of the comparisons are provided to selection logic 140. Selection logic 140 implements a bias circuit configuration policy predetermined for optimum leakage reduction based on the results and a desired data retention margin of the particular circuit block.

In another embodiment, the circuit of FIG. 5 can be simplified by masking, or bypassing, inputs of selection logic 140 from comparators 136 and 138 and asserting control signal SELECT DEFAULT to select a default bias circuit control configuration predefined by the BIAS CIRCUIT DEFAULT CONFIG bit field of register 132. In yet another embodiment, register 132 may only have bit fields LEAKAGE THRESHOLD and BIAS CIRCUIT DEFAULT CONFIG.

Figure 6:
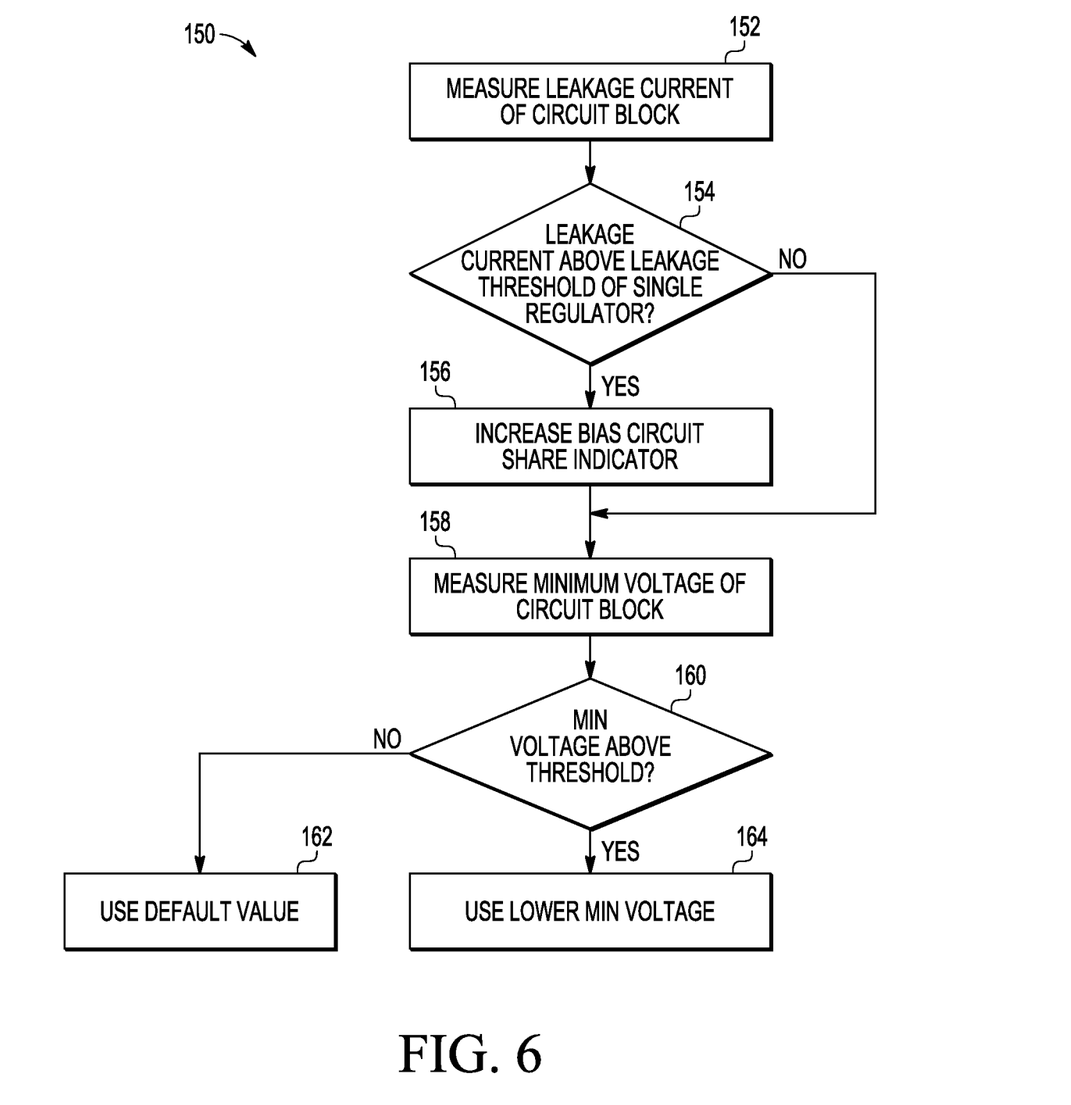
FIG. 6 illustrates a flow chart of a method for determining register values for the circuits of FIGS. 1 and 2.

FIG. 6 illustrates a flow chart of a method 150 for determining register values for registers 24 and 58 of the circuits of FIGS. 1 and 2, respectively. Method 150 will be discussed with references to FIG. 1, FIG. 5, and FIG. 6. Method 150 is begun by asserting test signal TEST to enter test mode. At step 152, a leakage current is measured at nodes N1 from circuit block 12 and at node N2 from circuit block 14. The leakage current is measured one circuit block at a time and the result is stored in a register corresponding to the circuit block. Each circuit block is identified using a CIRCUIT BLOCK ID from registers 132 and 134. At decision step 154, it is determined if the measured leakage current (LEAKAGE SIGNATURE) for the circuit block is above the leakage threshold (LEAKAGE THRESHOLD) of a single regulator, or leakage reduction circuit by using comparator 136. The result of the comparison is provided to selection logic 140. If the leakage current for a circuit block is not above the leakage threshold for a single leakage reduction circuit, the NO path is taken to step 158. If the leakage current is above the leakage threshold for a single leakage reduction circuit, the YES path to taken to step 156 and the bias circuit share indicator value (BIAS CIRCUIT SHARE INDICATOR) is increased to add leakage reduction circuits to control the leakage current at the minimum voltage desired at node N1 or N2. At step 158, a minimum voltage above VSS of the circuit block being tested, such as circuit block 12 or 14, is measured. At decision step 160, it is determined if the minimum voltage of the circuit block (VOLTAGE SIGNATURE) is above a predetermined threshold voltage (VOLTAGE THRESHOLD) using comparator 138. A result of the comparison is provided to selection logic 140. If the minimum voltage (VOLTAGE SIGNATURE) is not above the predetermined threshold voltage (VOLTAGE THRESHOLD), the NO path is taken to step 162 and the BIAS CIRCUIT DEFAULT CONFIG values stored in register 132 are used by asserting signal SELECT DEFAULT. If the minimum voltage (VOLTAGE SIGNATURE) is above the predetermined threshold voltage (VOLTAGE THRESHOLD), the YES path is taken to step 164 and the measured minimum voltage (VOLTAGE SIGNATURE) is used.

In one embodiment, method 150 can be performed and the registers values programmed during a testing phase of manufacturing. In another embodiment, method 150 can be performed by test circuitry implemented with the data processing system during, for example, startup of the data processing system. In this manner, variations in leakage current that occur because of, for example, temperature changes may be accounted for and the register values changed to maintain low power mode leakage current at a preferred value.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electronic circuit comprising:
   a plurality of circuit blocks, each circuit block of the plurality of circuit blocks including a first power terminal and a second power terminal, wherein the first power terminals of the plurality of circuit blocks are not directly coupled electrically;
   a plurality of bias circuits for controlling current leakage reduction of the plurality of circuit blocks;
   a switching circuit including a plurality of switches for selectively coupling a bias circuit of the plurality of bias circuits to the first power terminal of a circuit block of the plurality of circuit blocks, where each bias circuit is selectively couplable to each of the first power terminals of the plurality of circuit blocks and is concurrently couplable to more than one first power terminal of the plurality of circuit blocks via the switching circuit; and a plurality of leakage reduction transistors, each leakage reduction transistor of the plurality of leakage reduction transistors including a first current terminal coupled to a power supply voltage terminal, the plurality of bias circuits controlling the conductivity of the plurality of leakage reduction transistors to reduce leakage current of the plurality of circuit blocks, wherein each transistor of the plurality of transistors includes a control terminal for controlling the conductivity of the leakage reduction transistor.

2. An electronic circuit comprising:
a plurality of circuit blocks, each circuit block of the plurality of circuit blocks including a first power terminal and a second power terminal;
a plurality of bias circuits for controlling current leakage reduction of the plurality of circuit blocks;
a switching circuit including a plurality of switches for selectively coupling a bias circuit of the plurality of bias circuits to the first power terminal of a circuit block of the plurality of circuit blocks, where each bias circuit is selectively couplable to each of the plurality of circuit blocks and is concurrently couplable to more than one circuit block of the plurality of circuit blocks via the switching circuit;
a plurality of leakage reduction transistors, each leakage reduction transistor of the plurality of leakage reduction transistors including a first current terminal coupled to a power supply voltage terminal, the plurality of bias circuits controlling the conductivity of the plurality of leakage reduction transistors to reduce leakage current of the plurality of circuit blocks, wherein each transistor of the plurality of transistors includes a control terminal for controlling the conductivity of the leakage reduction transistor; and
a controller, the controller controlling the switching circuit for selectively coupling a bias circuit of the plurality of bias circuits to the first power terminal of a circuit block of the plurality of circuit blocks for reducing the leakage current of the circuit block, wherein the controller selects which bias circuit of the plurality of bias circuits to selectively couple to the first power terminal of a circuit block based on a measured leakage current value for the circuit block.

3. The electronic circuit of claim 2 further comprising:
at least one temperature sensor, wherein the controller selects which bias circuit of the plurality of bias circuits to selectively couple to the first power terminal of a circuit block further based on temperature information from the at least one temperature sensor.

4. An electronic circuit comprising:
a plurality of circuit blocks, each circuit block of the plurality of circuit blocks including a first power terminal and a second power terminal;
a plurality of bias circuits for controlling current leakage reduction of the plurality of circuit blocks;
a switching circuit including a plurality of switches for selectively coupling a bias circuit of the plurality of bias circuits to the first power terminal of a circuit block of the plurality of circuit blocks, where each bias circuit is selectively couplable to each of the plurality of circuit blocks and is concurrently couplable to more than one circuit block of the plurality of circuit blocks via the switching circuit; and
a plurality of leakage reduction transistors, each leakage reduction transistor of the plurality of leakage reduction transistors including a first current terminal coupled to a power supply voltage terminal, the plurality of bias circuits controlling the conductivity of the plurality of leakage reduction transistors to reduce leakage current of the plurality of circuit blocks, wherein each transistor of the plurality of transistors includes a control terminal for controlling the conductivity of the leakage reduction transistor, and wherein:
each leakage reduction transistor of the plurality of leakage reduction transistors is associated with a circuit block of the plurality of circuit blocks, wherein each leakage reduction transistor of the plurality of leakage reduction transistors includes a second current terminal coupled to the first power terminal of its associated circuit block; and
wherein the switching circuitry selectively couples a bias circuit of the plurality of bias circuits to the control terminal of the leakage reduction transistor of the plurality of leakage reduction transistors, where each bias circuit is selectively couplable to the control terminal of each leakage reduction transistor via the switching circuitry.

5. The electronic circuit of claim 4 wherein each bias circuit of the plurality of bias circuits includes a sense line, wherein the sense line of each bias circuit of the plurality of bias circuits is selectively couplable to the first power terminal of each circuit block of the plurality of circuit blocks via the switching circuit.

6. The electronic circuit of claim 1 wherein:
each leakage reduction transistor of the plurality of leakage reduction transistors is associated with a bias circuit of the plurality of bias circuits, wherein each leakage reduction transistor of the plurality of leakage reduction transistors includes a second current terminal; and
the second current terminal of each leakage reduction transistor of the plurality of leakage reduction transistors is selectively couplable to the first power terminal of each circuit of the plurality of circuit blocks via the switching circuit.

7. The electronic circuit of claim 1 wherein the power supply terminal is a circuit ground terminal and the first power terminal of a circuit block is a low voltage power terminal of the circuit block.

8. The electronic circuit of claim 1 wherein each bias circuit of the plurality of bias circuits is characterized as being a self biasing circuit.

9. An electronic circuit comprising:
a plurality of circuit blocks, each circuit block of the plurality of circuit blocks including a high power terminal and a low power terminal;
a plurality of bias circuits;
a switching circuit including a plurality of switches for selectively coupling a bias circuit of the plurality of bias circuits to the low power terminal of a circuit block of the plurality of circuit blocks, where each bias circuit of the plurality of bias circuits is selectively couplable to the low power terminal of each of the plurality of circuit blocks; and
a plurality of transistors, each transistor of the plurality of transistors including a first current terminal coupled to a circuit ground terminal, wherein each transistor of the plurality of transistors includes a control terminal for controlling the conductivity of the plurality of the transistors by a bias circuit of the plurality of bias circuits, and
wherein each transistor of the plurality of transistors is associated with a circuit block of the plurality of circuit blocks, wherein each transistor of the plurality of transistors includes a second current terminal coupled to the low power terminal of its associated circuit block; and wherein the switching circuitry selectively couples a bias circuit of the plurality of bias circuits to the control terminal of a transistor of the plurality of transistors, where each bias circuit is selectively couplable to the control terminal of each transistor of the plurality of transistors via the switching circuitry for controlling the conductivity of the each transistor.

10. The electronic circuit of claim 9 wherein each bias circuit is concurrently couplable to the low power terminal of more than one circuit block of the plurality of circuit blocks via the switching circuit.

11. The electronic circuit of claim 9 wherein each bias circuit of the plurality of bias circuits includes a sense line, wherein the sense line of each bias circuit of the plurality of bias circuits is selectively couplable to the low power terminal of each circuit block of the plurality of circuit blocks via the switching circuit.

12. The electronic circuit of claim 9 wherein each bias circuit of the plurality of bias circuits is characterized as being a self biasing circuit.

13. The electronic circuit of claim 9 further comprising:
a controller, the controller controlling the switching circuit for selectively coupling a bias circuit of the plurality of bias circuits to the low power terminal of a circuit block of the plurality of circuit blocks for reducing the leakage current of the circuit module, wherein the controller selects which bias circuit of the plurality of bias circuits to selectively couple to the low power terminal of the circuit block based on a measured leakage current value for the circuit block.

14. An electronic circuit comprising:
a plurality of circuit blocks, each circuit block of the plurality of circuit blocks includes a power terminal;
a plurality of transistors, each transistor of the plurality of transistors is associated with a circuit module of the plurality of circuit modules, wherein each transistor of the plurality of transistors includes a first current terminal coupled to a power supply terminal and a second current terminal coupled to the power terminal of its associated circuit module, each transistor of the plurality of transistors includes a control terminal for controlling the conductivity of the transistor;
a plurality of bias circuits; and
a switching circuit including a plurality of switches for selectively coupling a bias circuit of the plurality of bias circuits to the first power supply terminal of a circuit block of the plurality of circuit blocks and a control terminal of a transistor of the plurality of transistors associated with the circuit block, where each bias circuit is selectively couplable to the first power terminal of each of the plurality of circuit blocks via the switching circuit and selectively couplable to the control terminal of each transistor of the plurality of transistors via the switching circuit.

15. The electronic circuit of claim 14 wherein:
each bias circuit of the plurality of bias circuits includes a sense line and a control line;
for each bias circuit of the plurality of bias circuits, the switching circuit selectively couples the sense line of the each bias circuit of the plurality of bias circuits to the first power terminal of a circuit block of the plurality of circuit blocks and the control line of the each bias circuit to the control terminal of the transistor associated with the circuit block; and the first power terminal of each circuit module of the plurality of circuit modules is selectively couplable to each bias circuit of the plurality of bias circuits.

16. The electronic circuit of claim 14 wherein each bias circuit is concurrently couplable to the first power terminal of more than one circuit block of the plurality of circuit blocks via the switching circuit.

17. The electronic circuit of claim 14 further comprising:
a controller, the controller controlling the switching circuit for selectively coupling a bias circuit of the plurality of bias circuits to the first power terminal of a circuit module of the plurality of circuit modules for reducing the leakage current of the circuit module, wherein the controller selects which bias circuit of the plurality of bias circuits to selectively couple to the first power terminal of the circuit module based on a measured leakage current value for the circuit module.

18. A method for controlling leakage current in a circuit module, the method comprising:
measuring a leakage current in a circuit module; and
selecting a bias circuit of a plurality of bias circuits and coupling the selected bias circuit to the circuit module and controlling the conductivity of a transistor coupled to the circuit module with the bias circuit to control the leakage current of the circuit module, wherein the selected bias circuit is selected from the plurality of bias circuits based upon the measured leakage current.

19. The method of claim 18, wherein the selected bias circuit is further selected based on a measured data retention voltage value of the circuit module.

20. The method of claim 18, wherein each bias circuit includes a transistor associated with the bias circuit from a plurality of transistors, wherein the coupling the selected bias circuit to the control module includes coupling the associated transistor to the circuit module, wherein the controlling the conductivity of a transistor coupled to the circuit module with the bias circuit to control the leakage current of the circuit module includes controlling the conductivity of the associated transistor coupled to the circuit module with the selected bias circuit to control the leakage current of the circuit module.

21. The method of claim 18, further comprising:
detecting a change in temperature; and
in response to the detected the change in temperature, selecting a second bias circuit of the plurality of bias circuits, decoupling the selected bias circuit from the circuit module, coupling the second selected bias circuit to the circuit module, and controlling the conductivity of a transistor coupled to the circuit module with the second selected bias circuit to control the leakage current of the circuit module, wherein the second selected bias circuit provides for a different data retention margin than the selected bias circuit.

22. The method of claim 18 further comprising:
storing a leakage current threshold value, a data retention threshold value, and a bias circuit default configuration value corresponding to the circuit module in a first register;
storing the measured leakage current, a measured data retention voltage, a plurality of bias circuit share indicator values, and a plurality of bias circuit value indicators in a second register;
implementing a bias circuit configuration policy of the circuit module based on one or more of the values stored in the first and second registers.

23. The method of claim 22 further comprising:
increasing the bias circuit share indicator value when the measured leakage current is above the leakage current threshold of the circuit module;
using the default bias circuit share indicator value when the measured leakage current is below the leakage current threshold of the circuit module;
using a lower bias voltage value of the bias circuit when the measured data retention voltage is above the data retention voltage threshold of the circuit module; and
using the default bias voltage value of the bias circuit when the measured data retention voltage is below the data retention voltage threshold of the circuit module.

\* \* \* \* \*